(12) United States Patent
Hshieh

(10) Patent No.: US 6,172,398 B1
(45) Date of Patent: Jan. 9, 2001

(54) TRENCHED DMOS DEVICE PROVIDED WITH BODY-DOPANT REDISTRIBUTION-COMPENSATION REGION FOR PREVENTING PUNCH THROUGH AND ADJUSTING THRESHOLD VOLTAGE

(75) Inventor: Fwu-Iuan Hshieh, Saratoga, CA (US)

(73) Assignee: Magepower Semiconductor Corp., San Jose, CA (US)

( * ) Notice: Under 35 U.S.C. 154(b), the term of this patent shall be extended for 0 days.

(21) Appl. No.: 09/132,564

(22) Filed: Aug. 11, 1997

(51) Int. Cl.[7] .................................................. H01L 29/76
(52) U.S. Cl. .......................... 257/330; 257/328; 257/329; 257/341; 257/342
(58) Field of Search .................................. 257/329, 328, 257/330, 332, 342, 335, 339, 341

(56) References Cited

U.S. PATENT DOCUMENTS

| | | | |
|---|---|---|---|
| 5,021,845 | * 6/1991 | Hashimoto | 257/331 |
| 5,864,159 | * 1/1999 | Takahashi | 257/330 |
| 5,895,939 | * 4/1999 | Ueno | 257/279 |

* cited by examiner

Primary Examiner—Minh Loan Tran
Assistant Examiner—Shouxiang Hu
(74) Attorney, Agent, or Firm—Bo-In Lin

(57) ABSTRACT

This invention discloses a vertical DMOS transistor cell formed in a semiconductor substrate of a first conductivity type with a top surface and a bottom surface. The vertical DMOS transistor cell includes a trenched gate comprising polysilicon filling a trench opened from the top surface disposed substantially in a middle portion of the cell. The DMOS transistor cell further includes a source region of the first conductivity type surrounding the trenched gate near the top surface of the substrate. The DMOS transistor cell further includes a body region of a second conductivity type encompassing the source region. The body region surrounding the trenched gate and extends vertically to about one-half to two-third of the depth of the trenched gate. The body region further includes a body-dopant redistribution-compensation region under the source region near the trenched gate having a delta-increment body dopant concentration distribution higher than remaining portions of the body region.

10 Claims, 8 Drawing Sheets

TRENCHED DMOS DEVICE PROVIDED WITH BODY-DOPANT REDISTRIBUTION-COMPENSATION REGION FOR PREVENTING PUNCH THROUGH AND ADJUSTING THRESHOLD VOLTAGE

BACKGROUND OF THE INVENTION

1. Field of the Invention

This invention relates generally to the structure and fabrication process of trenched DMOS power transistors. More particularly, this invention relates to a novel and improved structure and process for fabricating trenched DMOS power device. This device is provided with flexibly adjustable threshold voltage and punch through prevention by adjusting the doping concentration of a body-dopant redistribution-compensation region under a source region near a vertical channel along the trenched gate of the DMOS transistor cells.

2. Description of the Prior Art

A trenched power DMOS device may be troubled by a punch through problem generated due to an anomaly encountered during silicon diffusion. The anomaly is a phenomenon recognized as the body dopant redistribution. The redistribution phenomenon is characterized by a "distribution coefficient m" representing the ratio of the equilibrium concentration of the impurity in silicon to its equilibrium concentration in the oxide for the impurity in a Si—SiO2 system. When the distribution coefficient m for a particular impurity is less than one, then a process of growing an oxide layer drives the impurity from the silicon region to the silicon dioxide region. The values of the distribution coefficient m for boron are function of crystal orientation. At typical diffusion temperature, the value of m ranges from 0.15 to 0.3 for {100} silicon. Due to the fact that the distribution coefficient m is smaller than one, FIGS. 1A and 1B shows the distribution of the boron concentration in the interface of the silicon and the oxide. The redistribution of the boron, i.e., the equilibrium concentrations, when a slow diffusion process is applied is even more pronounced as that shown in FIG. 1A than that of a slow diffusion shown in FIG. 1B.

Due to the redistribution of the boron ions when growing the gate-oxide, the body dopant concentration near the trenched gate is affected as that shown in FIGS. 2A and 2B. FIG. 2A is a cross sectional view of a trenched DMOS power device and FIG. 2B shows the net dopant concentration along two vertical line Y–Y' and Z–Z'. It is clear that the body dopant concentration near the trenched gate Y–Y' is lower than that along the line Z–Z' by a redistribution reduction δP. With a low body dopant concentration near the trenched gate and the channel region, an early punch through is more likely to occur due to insufficient body dopant concentration near the channel regions.

Therefore, a need still exits in the art of power device fabrication, particularly for trenched DMOS design and fabrication, to provide a structure and fabrication process that would resolve the difficulties caused by the body dopant redistribution. More specifically, it is preferably that reduction of the body dopant concentration caused by this dopant redistribution can be properly compensated without requiring application of additional masks or complicated fabrication processes. Furthermore, it is desirable in compensating the dopant concentration, the threshold voltage can be flexibly controlled by adjusting the body dopant concentration near the channel region next to the trenched gate.

SUMMARY OF THE PRESENT INVENTION

It is therefore an object of the present invention to provide an improved trench DMOS structure, and fabrication process to overcome the aforementioned difficulties encountered in the prior art.

Specifically, it is an object of the present invention to provide an improved trench DMOS structure and fabrication process wherein the reduced body dopant concentration due to redistribution during the process of gate-oxidation near the trenched gate is properly compensated. This is achieved by performing a high-energy body dopant implant after the source implant before the source blocking mask is removed. A redistribution-compensation region is formed right under the source region such that the punch through difficulty caused by the redistribution is resolved.

Another object of this invention is to provid an improved trench DMOS device by forming a body-dopant redistribution-compensation region under the source region near the trenched gate. By carefully controlling the body dopant concentration near the trenched gate and the channel region, the threshold voltage can be adjusted for specific power device applications.

Another object of this invention is to provid an improved trench DMOS structure and fabrication process by performing a highenergy body dopant implant after the source implant before the source blocking mask is removed. A redistribution-compensation region is formed right under the source region such that the punch through difficulty caused by the redistribution is resolved. The punch through difficulty is therefore resolved without requiring the application of additional masks or employing more complicated fabrication processes.

Briefly, in a preferred embodiment, the present invention discloses a vertical DMOS transistor cell formed in a semiconductor substrate of a first conductivity type with a top surface and a bottom surface. The vertical DMOS transistor cell includes a trenched gate comprising polysilicon filling a trench opened from the top surface disposed substantially in a middle portion of the cell. The DMOS transistor cell further includes a source region of the first conductivity type surrounding the trenched gate near the top surface of the substrate. The DMOS transistor cell further includes a body region of a second conductivity type encompassing the source region. The body region surrounding the trenched gate and extends vertically to about one-half to two-third of the depth of the trenched gate. The body region further includes a body-dopant redistribution-compensation region under the source region near the trenched gate having a delta-increment body-dopant concentration distribution higher than remaining portions of the body region.

The present invention further discloses a method for fabricating a DMOS transistor on a substrate, which has a reduced gate-to-drain capacitance and improved gate-oxide integrity. The method includes the steps of: (a) forming an epi-layer of a first conductivity type as a drain region on the substrate; (b) performing a blank body implant with impurities of a second conductivity type followed by a body-diffusion process at an elevated temperature thus forming a body region surrounding the trenched gate; (c) applying a trench mask for etching a trench followed by removing the mask and depositing a gate filling material then removed the gate filling material from above the top surface of the substrate thus forming a trenched gate; (d) applying a source mask for performing source implant for forming a plurality of source regions; (e) performing a high energy body dopant implant to form a plurality of body-dopant redistribution-compensation region under the source region near the trenched gates followed by removing the source mask and applying an elevated temperature for diffusing the source regions and the body-dopant redistribution-compensation region thus forming a delta-increment body-dopant concentration region in said body region near the trenched gate; (f) depositing an insulation layer on top of the power device followed by applying a contact mask for opening a plurality of source and gate contact openings followed by removing the contact mask; and (g) depositing a metal layer and applying a metal mask for etching and defining the gate metal and source metal segments. In a preferred embodiment, the step (e) of opening a plurality of source and gate contact openings further includes a step (g1) of performing a low energy body dopant implant through the source and gate openings to form a shallow high concentration body dopant for reducing a source and gate contact resistance before removing the contact mask.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1B:
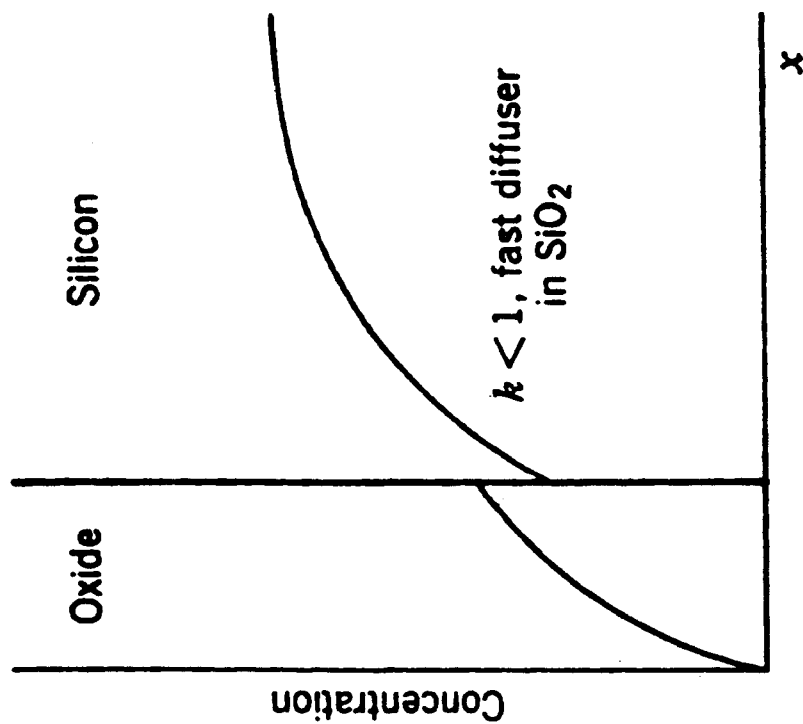
FIGS. 1A and 1B are diagrams showing the variations of boron dopant concentration as results of redistribution near an silicon dioxide layer in a slow and fast diffusion processes respectively.
Figure 1A:
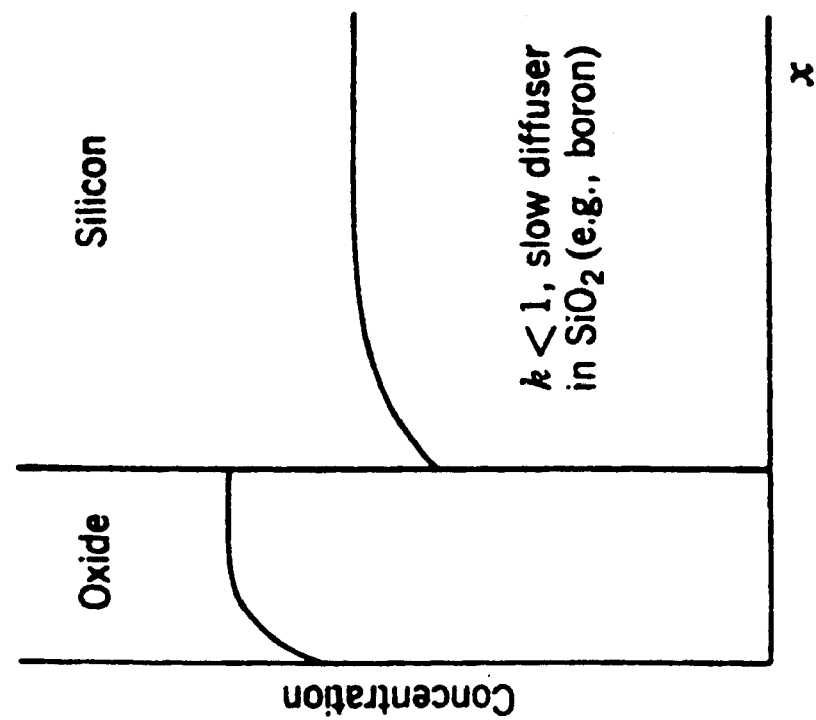
Figure 2A:
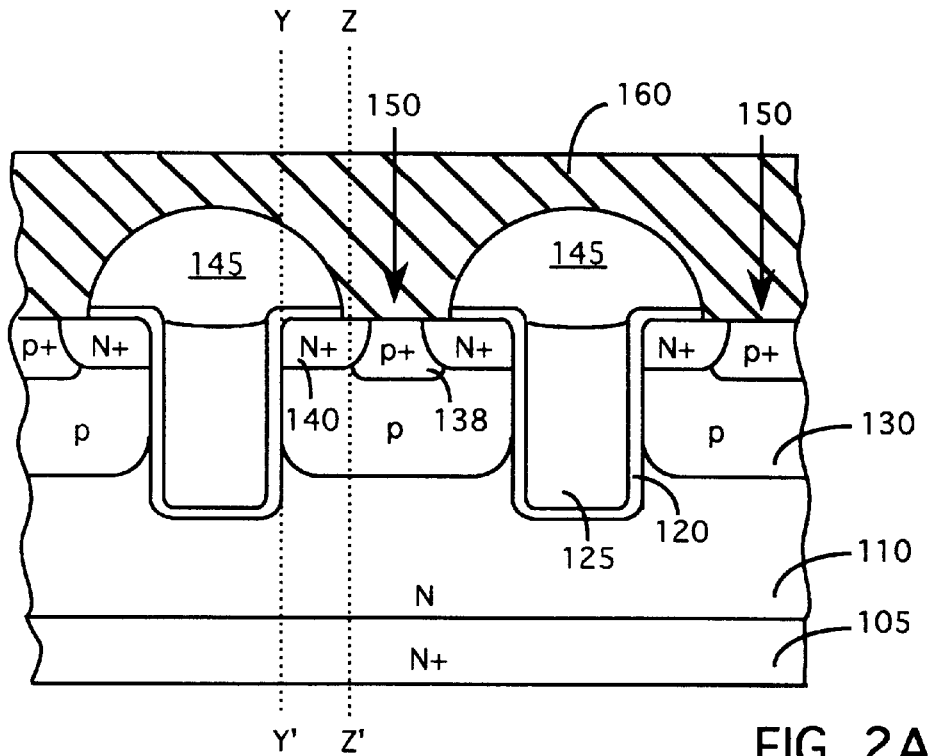
FIG. 2A is a cross-sectional view of a conventional trench DMOS transistor.
Figure 2B:
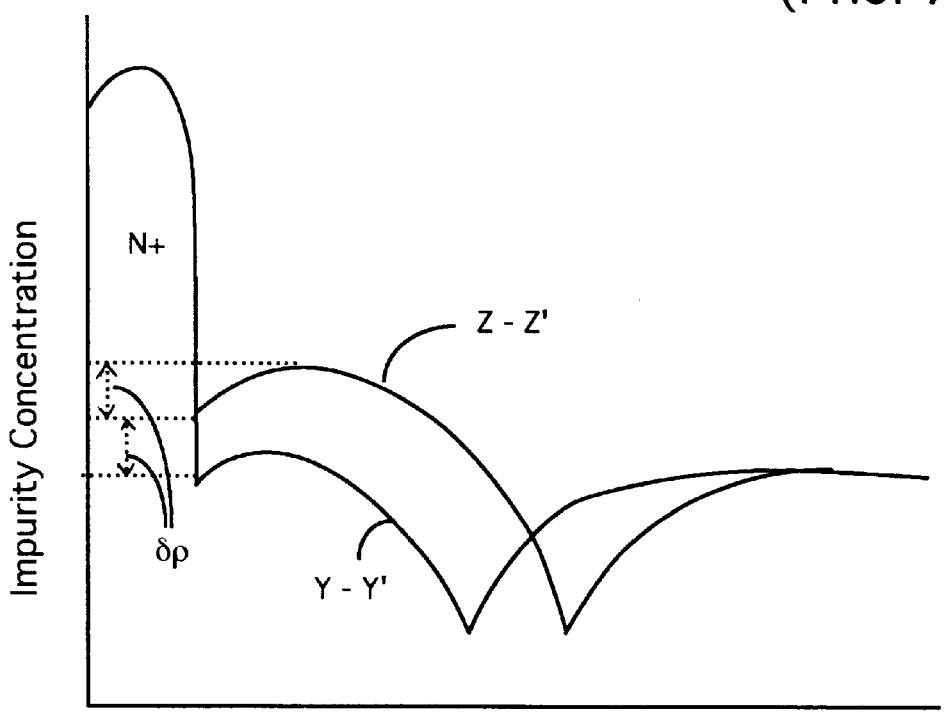
FIG. 2B shows the effects of the body dopant redistribution on the net dopant concentrations along two vertical lines Y–Y' and Z–Z' of FIG. 2A.
Figure 3A:
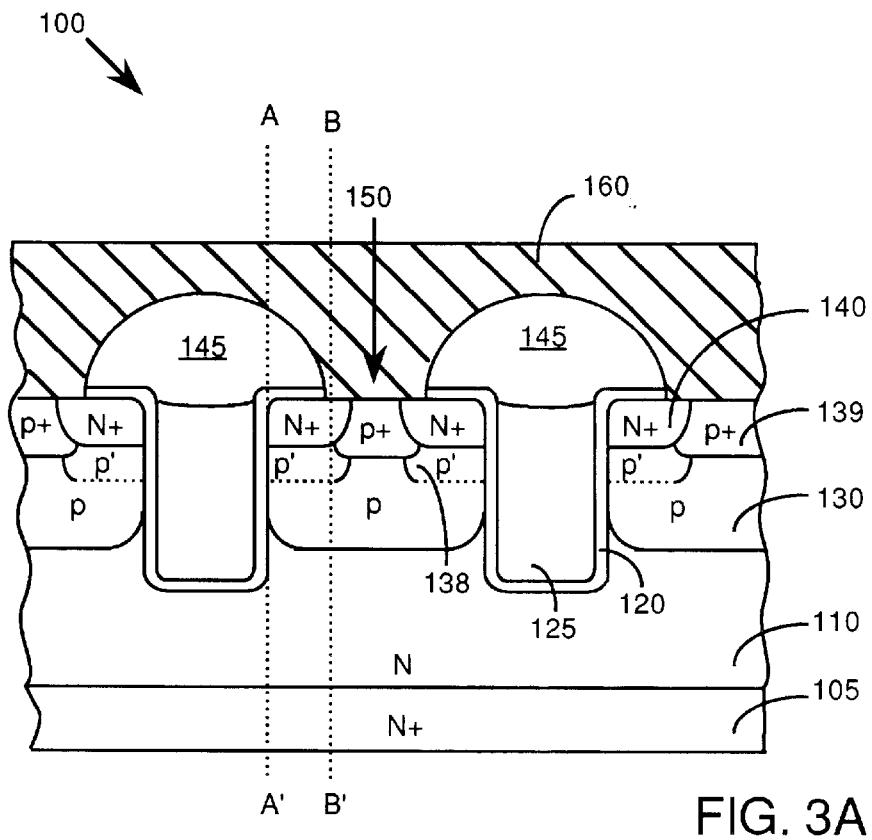
FIG. 3A is a cross-sectional view of an improved trench DMOS transistor of this invention.

FIG. 3A shows a cross sectional view of a trenched DMOS transistor 100 of the present invention. The trenched DMOS transistor 100 is formed on a N+ substrate 105 supporting a N epi-layer 110 thereon. The N epitaxial layer 110 supports the DMOS transistor cell 100 with the bottom substrate layer functions as a drain for the transistor. The DMOS transistor cell 100 includes a trenched gate 125 disposed substantially in a middle portion of the cell. The trenched gate 125 is formed by filling a trench opened from the top surface of the substrate with polysilicon or other gate-filing materials. The trenched gate 125 is surrounded by a N+ source region 140 formed next to the trenched gate 125 near the top surface of the substrate. A P-body region 130 encompasses the source region 140 surrounding the trenched gate 125. The P-body region 130 has a depth about one-half to three-quarter of the depth of the trenched gate 125 and extends laterally between two neighboring trenched gates 125. The transistor cell 100 further includes a body-dopant redistribution-compensation region, i.e., a P' region 138 formed in the P-body region under the source region 140 near the trenched gate.

Figure 3B:
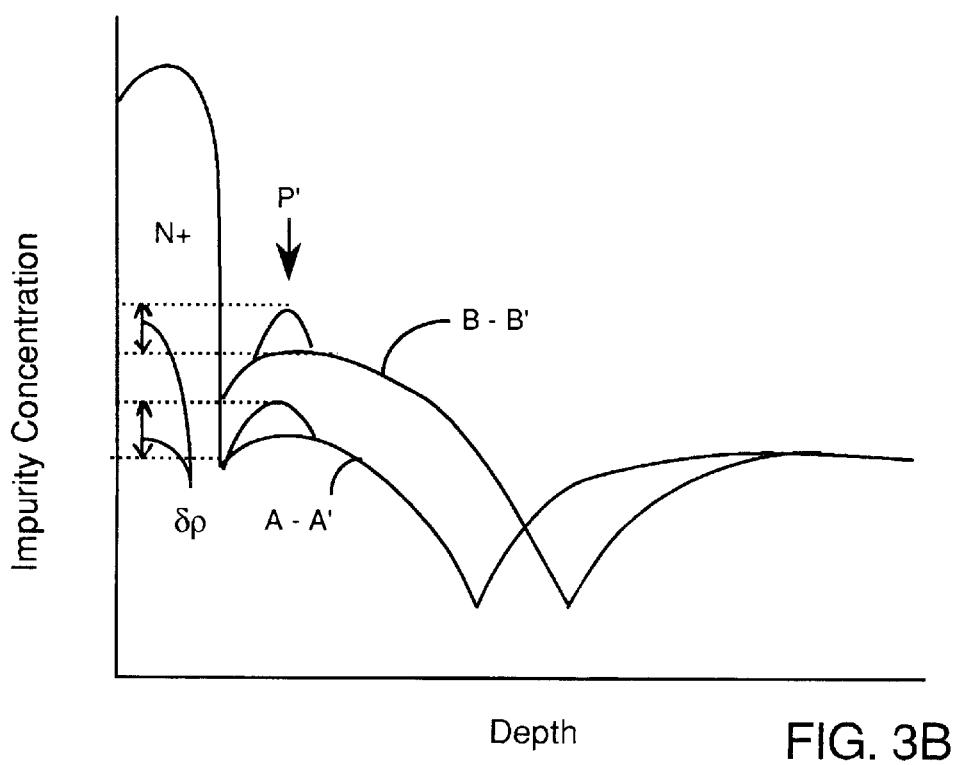
FIG. 3B shows net dopant concentrations along two vertical lines A–A' and B–B' of FIG. 3A with a redistribution-compensation region under the source region near the trenched gate.
Figure 4:
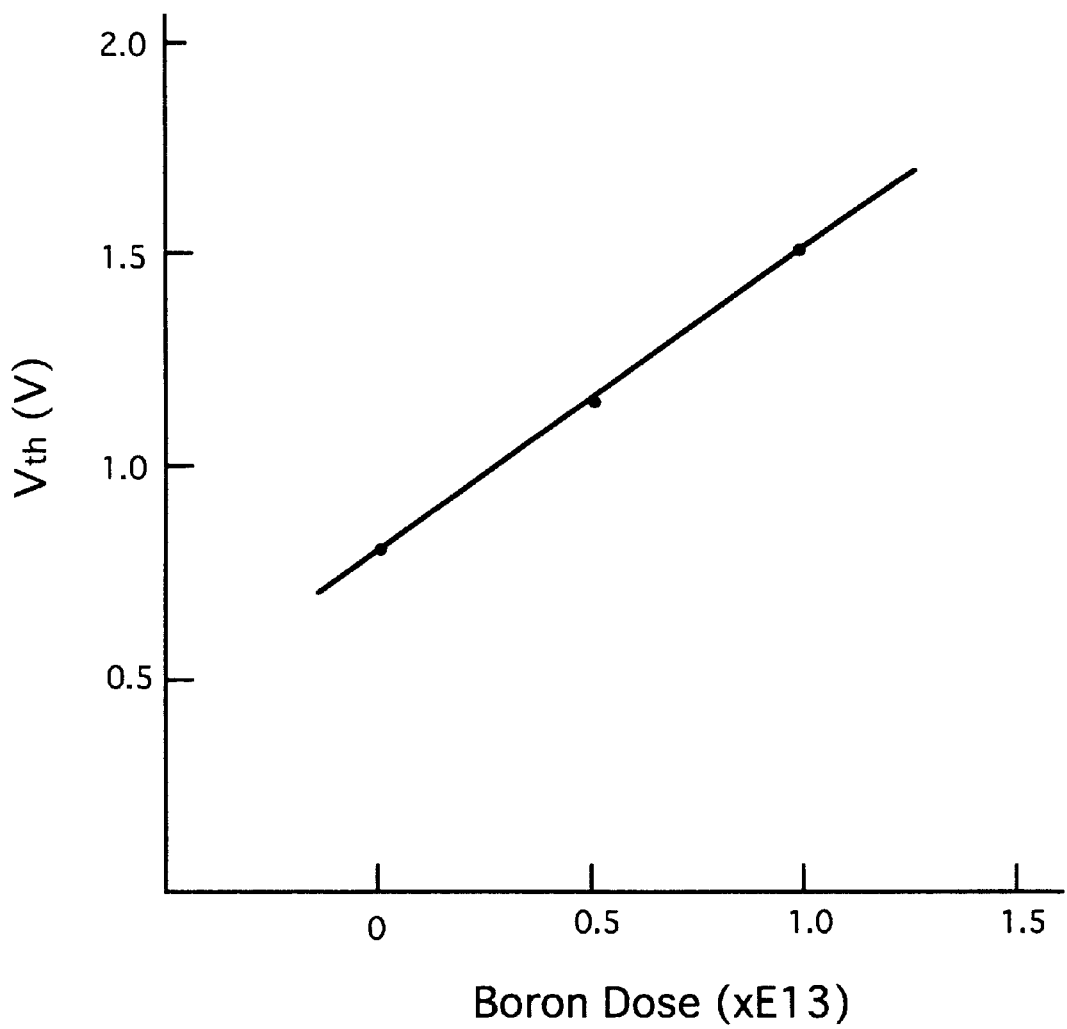
FIG. 4 is a diagram showing the variation of the threshold voltage as a function of the high energy implant dose in forming a redistribution-compensation region.

FIG. 3B shows the net dopant concentrations along two vertical lines A–A' and B–B'. In this redistribution-compensation region 138, there is a delta-incremented boron concentration higher than the remaining portion of the body region 130. By increasing the body dopant concentration along A–A' by an amount of $\delta P$, the effect of boron redistribution is properly compensated. The detrimental effect of early punch through due to the boron redistribution during gate-oxidation is eliminated. Additionally, the threshold voltage of the DMOS transistor cells can be adjusted by adjusting the net dopant concentration near the channel region. By increasing the net dopant concentration in the body-dopant redistribution compensation region 138 along the line A'A', a higher threshold voltage can be achieved. Therefore, this invention provides another advantage of controlling the threshold voltage by carefully adjusting the dopant concentration in the redistribution-compensation region near the channel regions. FIG. 4 is a is a diagram showing the variations of the threshold voltage as a function of the boron dose applied in forming the redistribution compensation region 138 near the channel region. The threshold voltage Vth is increased substantially in a linear fashion with an increment of the boron implantation dose. A method is therefore provided to precisely control the threshold voltage of a DMOS power device by controlling the body dopant implantation dose.

Furthermore, in this body-dopant redistribution compensation region 138, with a higher body-dopant concentration than the surrounding P-body, the parasitic resistance over the body region 130 is lowered and the ruggedness of the transistor cell is improved. This is achieved because the voltage drop across the body regions is decreased by reducing the parasitic resistance thus decreasing the likelihood of incidentally turning on the parasitic NPN transistors.

Overlying the top surface of the supporting substrate, an insulation layer 145 is formed to protect and insulate the DMOS transistor with a plurality of source contact openings 150 to form an electric contact between the source regions 140 and the source metal layer 160. The DMOS transistor cell further includes a shallow high-concentration body dopant region 139 formed right under the source contact opening 150. A higher body dopant provided in this region reduces the contact resistance between the source metal layer 150 to the source region 140.

The trenched DMOS transistor 100 as shown has the advantage that an early punch through caused by a lower body dopant concentration near channel region due to boron redistribution in gate-oxidation can be effectively prevented. Furthermore, the threshold voltage of the DMOS transistor, which is a function of the body-dopant concentration near the channel region can be flexibly controlled and adjusted. A more detail description of the manufacture process will further explain the method to adjust and control the threshold voltage. Additionally, by lowering the body resistance, the device ruggedness is also improved.

According to FIGS. 3A and 3B and above descriptions, this invention discloses a vertical DMOS power transistor 100 formed in a semiconductor substrate 105 with a top surface and a bottom surface. The vertical DMOS transistor cell 100 includes a trenched gate 125 comprising polysilicon filling a trench opened from the top surface disposed substantially in a middle portion of the cell. The DMOS transistor cell 100 further includes a source region 140 of the first conductivity type surrounding the trenched gate 125 near the top surface of the substrate. The DMOS transistor cell further includes a body region 130 of a second conductivity type surrounding the trenched gate 125 encompassing the source region 140. The body region 130 further includes a body-dopant redistribution-compensation region 138 disposed below the source region 140 for providing a delta-incremented body dopant concentration near a channel region along the trenched gate 125. The body-dopant redistribution-compensation region 138 is provided for preventing an early punch through caused by a boron-redistribution in a gate-oxidation and for adjusting a threshold voltage of said DMOS transistor cell. In a preferred embodiment, the body-dopant redistribution-compensation region 138 disposed in a depth about 0.1 to 0.4 micrometers below the source region 140 near the channel along the trenched gate 125. In a preferred embodiment, the body-dopant redistribution-compensation region 138 providing a delta-incremented body dopant concentration of $\delta P$ wherein $\delta P$ is a delta-incremented body-dopant concentration of about $1 \times 10^{16}$ to $5 \times 10^{16}/cm^3$. In another preferred embodiment, the body-dopant redistribution-compensation region 138 providing a delta-incremented body dopant concentration of $\delta P$ wherein $\delta P$ is applied for controlling a threshold voltage and for punch through prevention.

In summary, the present invention discloses a semiconductor power device 100 formed in a semiconductor substrate 105 with a top surface and a bottom surface. The power device comprising a drain 105 disposed at the bottom surface, a trenched gate comprising a trench opened from the top surface of the substrate filled with a gate material filled therein. The power device further includes a source 140 near the top surface of the substrate surrounding the trenched gate 125. The power device further includes a body region 130 in the substrate surrounding the trenched gate 125 encompassing said source region 140. The body region further includes a body-dopant redistribution-compensation region 138 under the source region near the trenched gate 125 provided with delta-incremented body dopant concentration. In a preferred embodiment, the body-dopant redistribution-compensation region 138 having a body-dopant that is thirty to one-hundred percents higher than the body dopant concentration of the body region for adjusting a threshold voltage of the semiconductor power device.

Figure 5A:
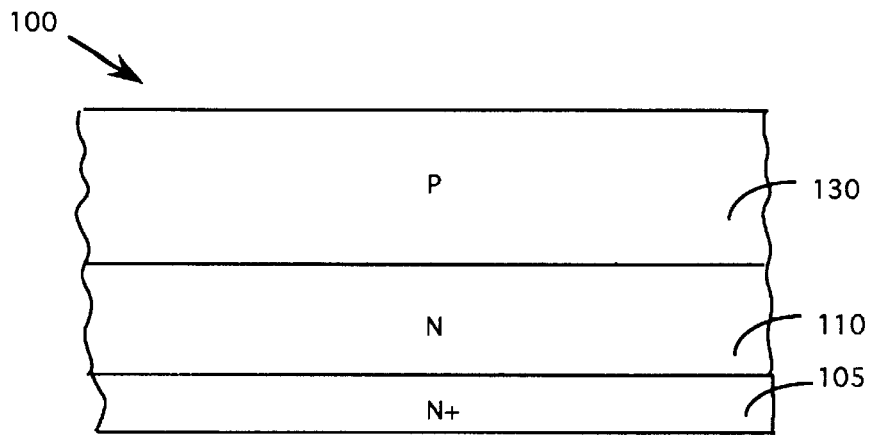
FIGS. 5A to 5F are a series of cross sectional views for illustrating the manufacturing processes for fabricating a DMOS power device of FIG. 3A provided with redistribution-compensation region.
Figure 5B:
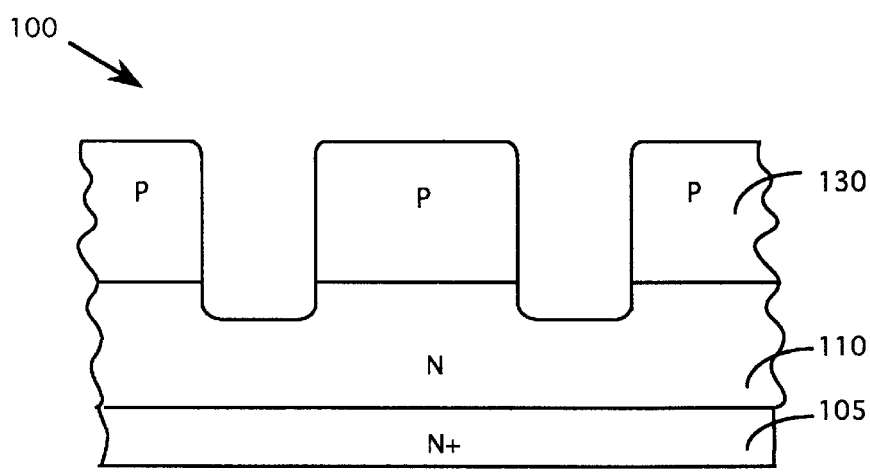

Please refer to FIGS. 5A to 5F for the processing steps carried out to manufacture a power DMOS device 100 of this invention. As shown in FIG. 5A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 $\mu$m) A blank p-boy implant is carried out with boron ions at 30–100 Kev with an ion beam of $2 \times 10^{13}$ to $2 \times 10^{14}/cm^2$ flux density to form the p-body region 130. A p-body diffusion process is then carried out at an elevated temperature of 1,000–1,200° C. for ten minutes to three hours to increase the depth of the p-body region 120 to 1.0–2.0 m. Referring to FIG. 3B, a photoresist employed as a trench mask (not shown) to carry out a trench etch process. The trench etch process is a dry anisotropic etch process. Gate trenches of 1.0 to 2.0 microns in width and 1.0 to 2.0 micrometers in depth are formed.

Figure 5C:
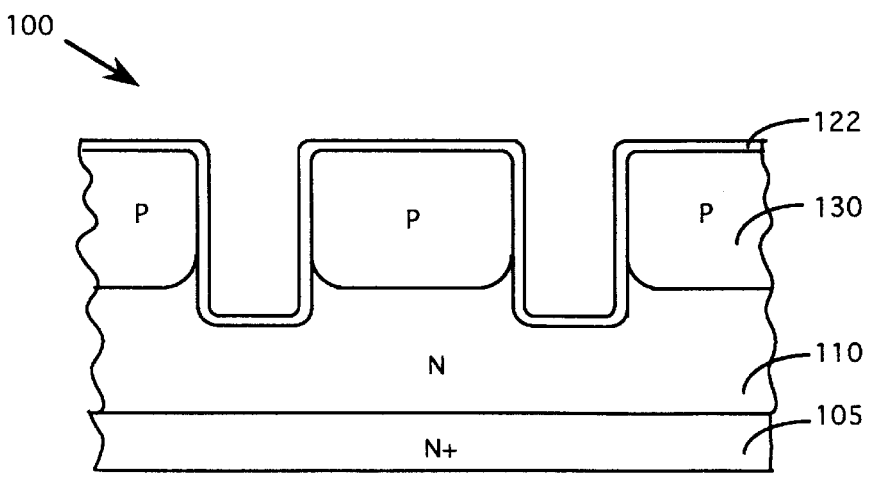

In FIG. 5C, a sacrification oxidation process is applied which can be either a dry or wet oxidation process conducted at a temperature of 900–1100° C. to form oxide layer of approximately 300–2000 Å in thickness which is followed by a scarification oxide etch process. A gate oxidation process, which can be a wet or dry oxidation process are carried out to form a gate oxide layer 122 at a temperature of 800 to 1100° C. to form a layer of thickness in the range of 200 to 1,000 Å. A polysilicon deposition process is performed to deposit a polysilicon layer 125 ranging from 1.5 to 3.0 m in thickness. In FIG. 5C, a total etch process is performed to remove the polysilicon layer 125 and leaving only the gate material, e.g., the polysilicon in the bottom part of the trenches. A POCL3 doping process is carried out at 950° C. to make the polysilicon layer 125 have a sheet resistance of 20–40 ohm/cm$^2$.

Figure 5D:
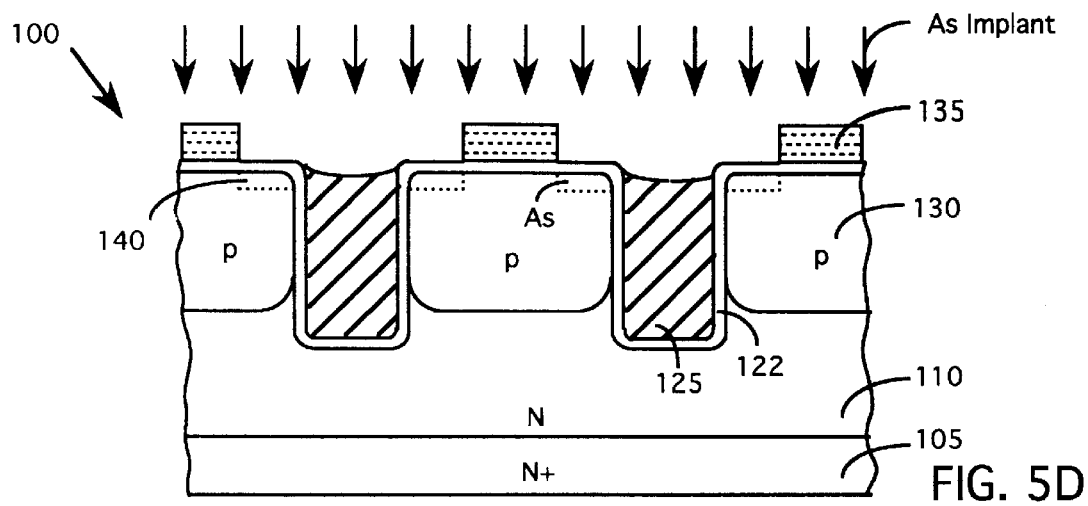

Referring to FIG. 5D, a N+ block source mask 135 is applied to carry out an N+ implant to form the N+ region 140. The N+ implantation is carried out with an arsenic or phosphorus ion beam 124 at an energy of 40–100 Kev and ion flux density of $5 \times 10^{15}$ to $1 \times 10^{16}/cm^2$ to form a plurality of N+ source regions 140. Then, before the N+ source mask 135 is removed, a high-energy body dopant implant is performed at an energy of 200–400 Kev and ion flux density of $3 \times 10^{12}$ to $3 \times 10^{13}/cm^2$ to form a plurality of body-dopant redistribution-compensation region 138 under the source regions 140 near the trenched gates 125.

Figure 5E:
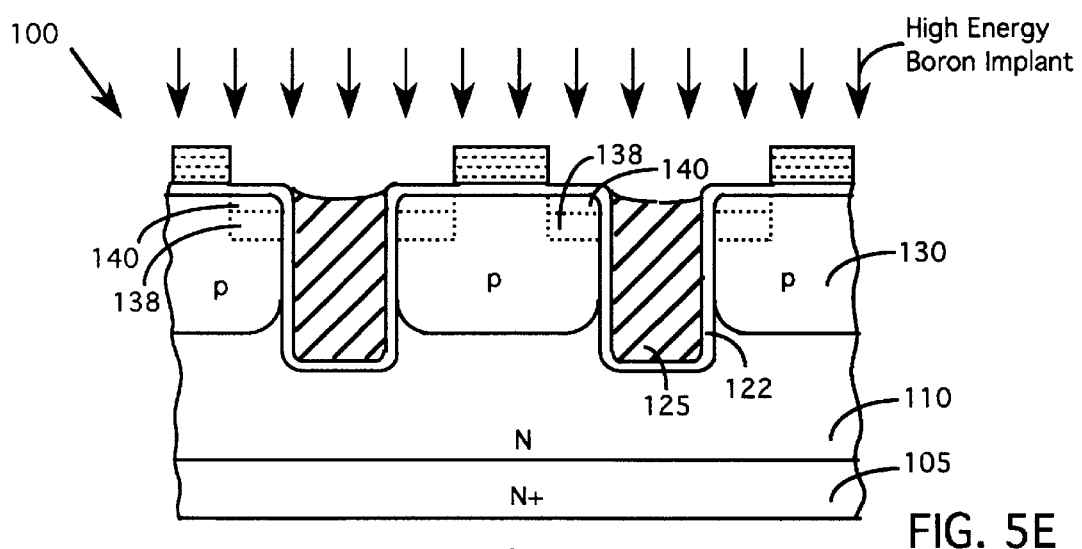
Figure 5F:
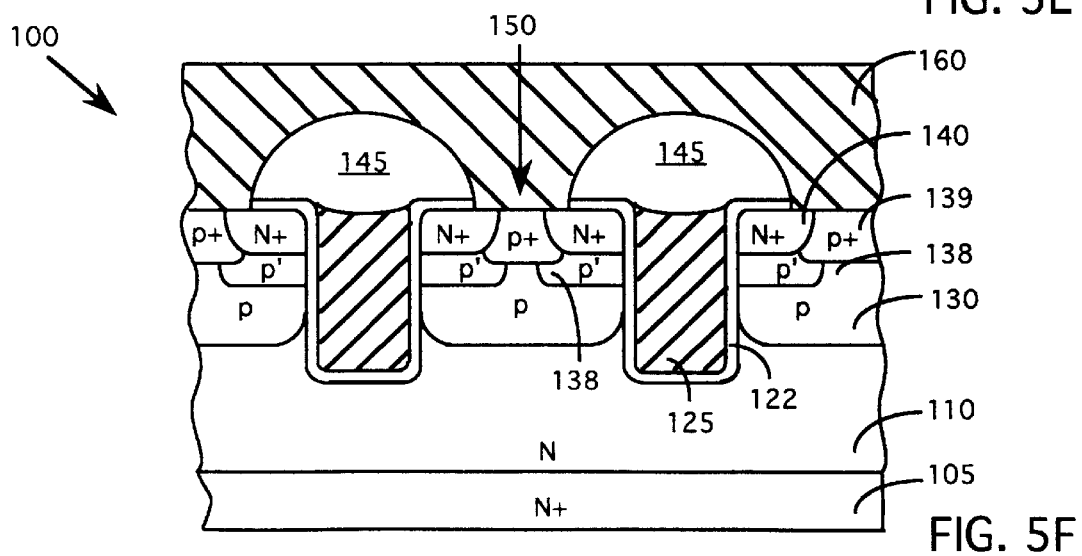

Referring to FIG. 5E, the resist, i.e., the N+ blocking mask 135, is stripped and the N+ source regions 140 are driven into desired junction depth. The source regions are driven to a depth ranging from 0.2 to 1.0$\mu$ and the body-dopant redistribution-compensation region 138 right below the source regions 140 by a diffusion process at a temperature of 900–1000° C. for 10 minutes to two hours. An insulation layer 145, e.g., a BPSG or a PSG layer of approximately 5000–15,000 Å in thickness is deposited over the entire surface. A BPSG flow or BSG densification process is performed at 900–950° C. for thirty minutes to one hour. A contact mask (not shown) is employed to etch through the BPSG or the BSG insulation layer 145 to open a plurality of source contact openings in the core cell area and gate contact in the gate contact area (not shown). A shallow body dopant implant is performed by implanting through the contact openings with boron ions at 30–100 Kev with an ion beam of $5 \times 101^4$ to $5 \times 10^{15}/cm^2$ flux density thus forming a plurality of shallow high-concentration-body dopant regions 139 underneath the source contact openings 150. A layer of contact metal is deposited over the entire top surface. A metal mask (not shown) is then employed to etch and define the source contacts 160 and the gate contact 180.

According to FIGS. 5A to 5F and above description, the present invention further discloses a method for fabricating a DMOS power device on a substrate provided with improved punch through prevention and threshold voltage control. The method includes the steps of: (a) forming an epi-layer 110 of a first conductivity type as a drain region on the substrate 105; (b) performing a blank body implant with impurities of a second conductivity type followed by a body-diffusion process at an elevated temperature thus forming a body region 130 (c) applying a trench mask for etching a trench followed by removing the mask and depositing a gate filling material then removed the gate filling material from above the top surface of the substrate thus forming a trenched gate 125; (d)applying a source mask 145 for performing source implant for forming a plurality of source regions 140 followed by carrying out a high energy body-dopant implant for forming a body-dopant redistribution-compensation region 138 under the source region 140 near the trenched gate 125 before removing the source mask; (e) depositing an insulation layer 145 on top of the power device followed by applying a contact mask for opening a plurality of source and gate contact openings 150 followed by removing the contact mask; and (f)depositing a metal layer and applying a metal mask for etching and defining the gate metal and source metal segments. In a preferred embodiment, the step (e) of opening a plurality of source and gate contact openings 150 further includes a step (g1) of performing a shallow body dopant implant through the source and gate openings to form a shallow high concentration body dopant region 139 below the source contact openings 150 for reducing source contact resistance before removing the contact mask.

Figure 6A:
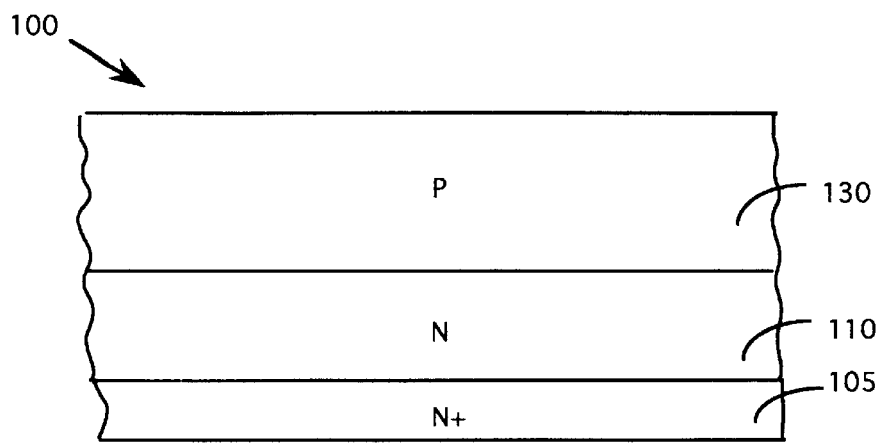
FIGS. 6A to 6F are a series of cross sectional views for illustrating the manufacturing processes for fabricating an alternate DMOS power device having a redistribution compensation region of this invention.
Figure 6B:
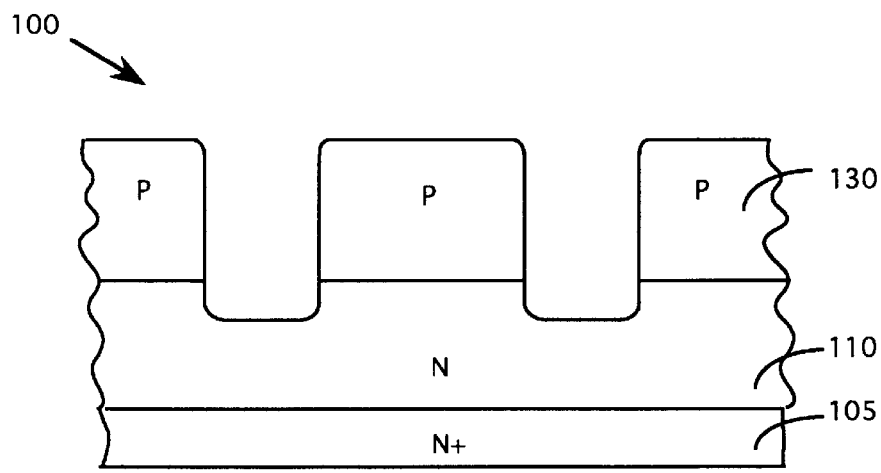
Figure 6C:
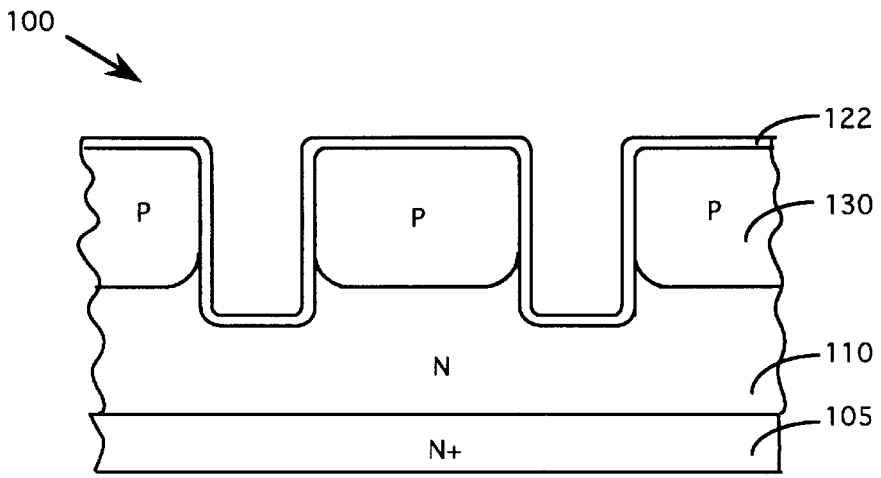
Figure 6D:
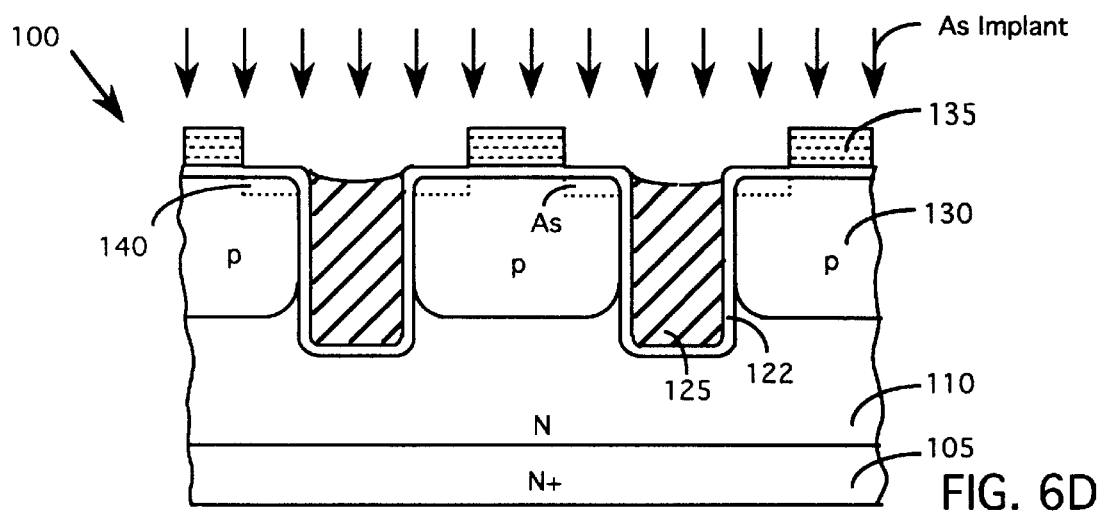
Figure 6E:
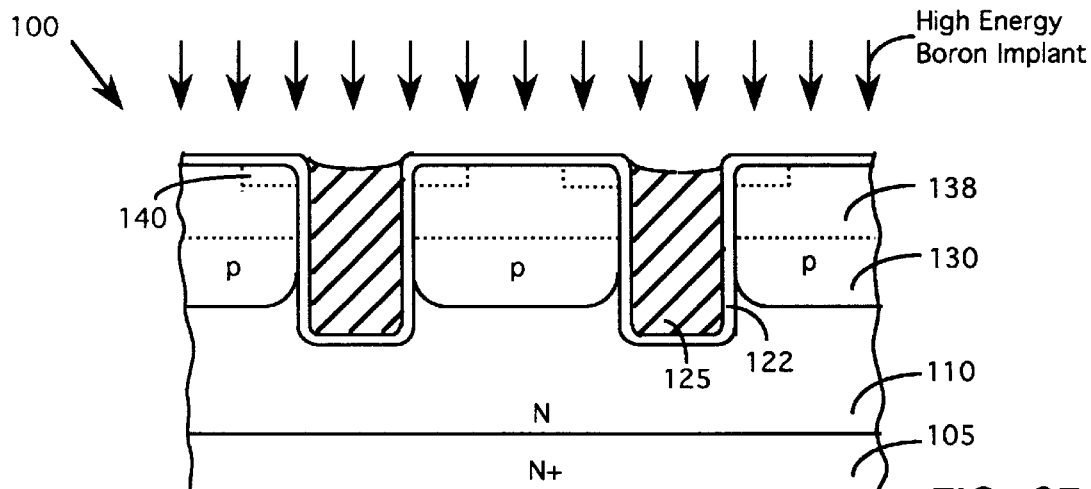
Figure 6F:
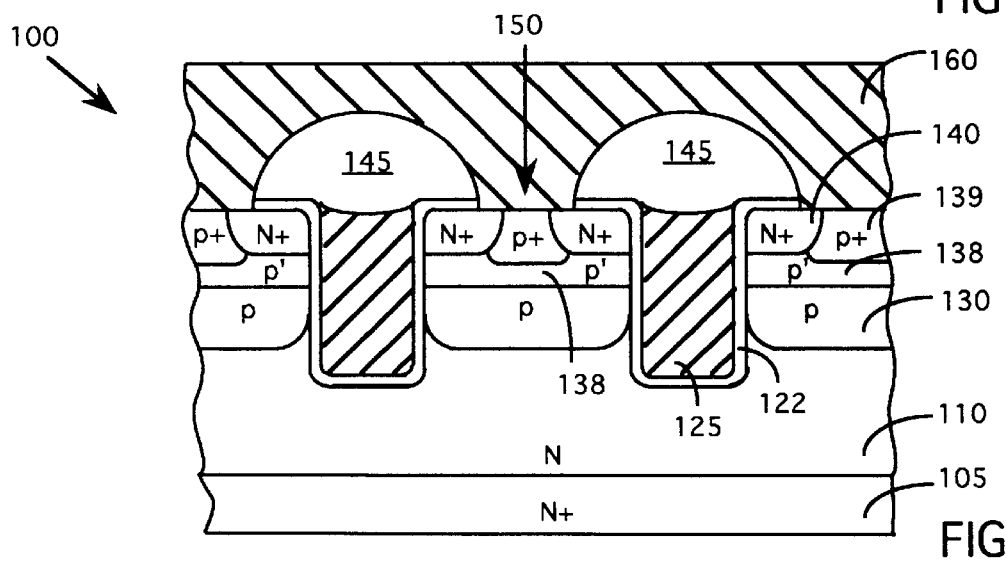

Please refer to FIGS. 6A to 6F for alternate processing steps carried out to manufacture a power DMOS device 100 of this invention. The processing steps illustrated in FIGS. 6A to 6C are identical to that shown in FIGS. 5A to 5C. In FIG. 6D, an N+ block source mask 135 is applied to carry out an N+ implant to form the N+ region 140. The N+ implantation is carried out with an arsenic or phosphorus ion beam 124 at an energy of 40–100 Kev and ion flux density of $5 \times 10^{15}$ to $1 \times 10^{16}/cm^2$ to form a plurality of N+ source regions 140. Then, in FIG. 5E, the source-blocking mask 135 is removed and a high-energy body-dopant implant is carried out The body dopant implant is performed at an energy of 200–400 Kev and ion flux density of $3 \times 101^2$ to $1 \times 10^{13}/cm^2$ to form a plurality of body-dopant redistribution-compensation region 138 under the source regions 140 to compensate the boron redistribution near the trenched gates 125. The processing steps performed in FIG. 6F are similar to that described for FIG. 5F and therefore will not be repeated here.

In summary, this invention also discloses a method for fabricating a trenched power transistor cell on a substrate 110. The method includes the steps of (a) forming a body region 130; (b) forming a trenched gate 125 by opening a trench in the substrate 110 following by filling a gate-material therein; and (c) forming a body-dopant redistribution-compensation region 138 near the trenched gate to compensate a reduced body dopant during step (b) of forming the trenched gate 125.

Therefore, the present invention provides an improved trenched DMOS structure and fabrication process to overcome the difficulties of an early punch through and low threshold voltage for trenched DMOS power device with short channels as encountered in the prior art. Specifically, an improved trench DMOS structure and fabrication process are disclosed. The reduced body dopant concentration due to redistribution during the process of gate-oxidation near the trenched gate is properly compensated. This is achieved by performing a high-energy body dopant implant after the source implant before the source blocking mask is removed. A redistribution-compensation region is formed right under the source region such that the punch through difficulty caused by the redistribution is resolved. By carefully controlling the body dopant concentration near the trenched gate and the channel region, the threshold voltage can be adjusted for specific power device applications. A redistribution-compensation region is formed right under the source region by performing a high-energy body dopant implant after the source implant before the source-blocking mask is removed. Therefore, the punch through difficulty is resolved without requiring the application of additional masks or employing more complicated fabrication processes.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A vertical DMOS transistor cell formed in a semiconductor substrate of a first conductivity type with a top surface and a bottom surface, said DMOS transistor cell comprising:

a trenched gate having a polysilicon filling a trench opened from said top surface disposed substantially in a middle portion of said transistor cell;

a source region of said first conductivity type surrounding said trenched gate near said top surface of said substrate;

a body region of a second conductivity type surrounding said trenched gate encompassing said source region;

said body region further includes a body-dopant redistribution-compensation region disposed immediately below said source region for providing a delta-incremented body dopant concentration near a channel region along said trenched gate immediately below said source region and having a substantially same width as said source region for adjusting a threshold voltage of said vertical DMOS transistor cell.

2. The vertical DMOS transistor cell of claim 1 wherein:

said body-dopant redistribution-compensation region disposed in a depth about 0.1 to 0.4 micrometers immediately below and having a substantially same width as said source region near said channel along said trenched gate.

3. The vertical DMOS transistor cell of claim 1 wherein:

said body-dopant redistribution-compensation region providing a delta-incremented body dopant concentration of δP immediately below and having a substantially same width as said source region along said trenched gate wherein δP is a delta-incremented body-dopant concentration of about $1 \times 10^{16}$ to $5 \times 10^6/cm^3$.

4. The vertical DMOS transistor cell of claim 1 wherein:

said body-dopant redistribution-compensation region providing a delta-incremented body dopant concentration of δP immediately below and having a substantially same width as said source region along said trenched gate wherein δP is applied for controlling a threshold voltage and for punch through prevention.

5. The vertical DMOS transistor cell of claim 1 wherein:

said body region further includes a shallow high-concentration body-dopant region disposed next to said source region having a higher body-dopant concentration than said body region for reducing a source-contact resistance.

6. A vertical power transistor cell formed in a semiconductor substrate of a first conductivity type with a top surface and a bottom surface, said power transistor cell comprising:

a trenched gate comprising a gate-material filling a trench opened from said top surface disposed substantially in a middle portion of said transistor cell;

a body region of a second conductivity type surrounding said trenched gate;

said body region further includes a body-dopant redistribution-compensation region disposed immediately below and having a substantially same width as said source region for providing a delta-incremented body dopant concentration of said second conductivity type near a channel region along a trenched gate immediately below said source region for adjusting a threshold voltage of said vertical power transistor cell.

7. The vertical power transistor cell of claim 6 wherein:

a said source region of said first conductivity type encompassed in said body region surrounding said trenched gate near said top surface of said substrate; and said body-dopant redistribution-compensation region disposed in a depth about 0.1 to 0.4 micrometers immediately below and having a substantially same width as said source region near said channel along said trenched gate.

8. The vertical power transistor cell of claim 6 wherein:

said body-dopant redistribution-compensation region providing a delta-incremented body dopant concentration of δP wherein δP is a delta-incremented body-dopant concentration of about $1 \times 10^{16}$ to $5 \times 10^6/cm^3$. said body-dopant redistribution-compensation region providing a delta-incremented body dopant concentration of δP immediately below and having a substantially same width as said source region along said trenched gate wherein δP is a delta-incremented body-dopant concentration of about $1 \times 10^{16}$ to $5 \times 10^{16}/cm^3$.

9. The vertical power transistor cell of claim 6 wherein:

said body-dopant redistribution-compensation region providing a delta-incremented body dopant concentration of δP immediately below and having a substantially same width as said source region along said trenched gate wherein δP is applied for controlling a threshold voltage and for punch through prevention.

10. The vertical power transistor cell of claim 6 wherein:

said body region further includes a shallow high-concentration body-dopant region disposed next to said source region having a higher body-dopant concentration than said body region for reducing a source-contact resistance.

* * * * *